United States Patent [19]
Takada et al.

[11] Patent Number: 5,250,120
[45] Date of Patent: Oct. 5, 1993

[54] PHOTOVOLTAIC DEVICE

[75] Inventors: Jun Takada; Akihiko Nakajima; Katsuhiko Hayashi; Keizo Asaoka; Yoshihisa Tawada, all of Hyogo, Japan

[73] Assignee: Kanegafuchi Chemical Industry Co., Ltd., Osaka, Japan

[21] Appl. No.: 802,996

[22] Filed: Dec. 5, 1991

[30] Foreign Application Priority Data

Dec. 7, 1990 [JP] Japan .................... 2-400801

[51] Int. Cl.$^5$ .............. H01L 31/04; H01L 31/0224; H01L 31/0376
[52] U.S. Cl. .................... 136/256; 136/258; 136/259; 257/436; 257/762
[58] Field of Search ............ 136/256, 258 AM, 259; 357/30 J, 30 K, 30 Q, 71; 257/4, 53, 436, 741, 746, 750, 762

[56] References Cited
FOREIGN PATENT DOCUMENTS 61-99385 5/1986 Japan .................... 136/256

OTHER PUBLICATIONS

Advancing Toward Technology Breakout in Energy Conversion, 21st Intersociety Energy Conversion Engineering Conference, San Diego, California, Aug. 25–29, 1986, pp. 1292–1299.

Primary Examiner—Aaron Weisstuch
Attorney, Agent, or Firm—Jordan and Hamburg

[57] ABSTRACT

This invention relates to a photovoltaic device, such as a solar cell or a photosensor, which comprises an amorphous silicon semiconductor photosensitive layer and, as disposed on respective sides thereof, a transparent electrode and a rear electrode. The rear electrode is a multi-layer structure constructed by alternately successive depositions, each in a thickness of 0.3 to 50 nm, of two or more metals selected from the group consisting of Cu, Ag, and Au. In using such a Cu/Ag multi-layer structure or an Au/Ag multi-layer structure as the rear electrode, the thickness of each Cu or Au layer is controlled at 0.3 to 20 nm and that of each Ag layer at 1 to 50 nm. The total thickness of the rear electrode is 20 nm to 1 μm. This construction insures improved photoelectric conversion efficiency and improved reliability of the device.

8 Claims, 1 Drawing Sheet

PHOTOVOLTAIC DEVICE

BACKGROUND OF THE INVENTION

Technical Field

The present invention relates to photovoltaic devices and more particularly to a photovoltaic device, such as a solar cell or a photosensor, which has a rear electrode on one side of a photosensitive layer which is opposite to the side on which light is incident.

Technical Background

A photovoltaic device in general consists of a photosensitive layer made of, for example, an amorphous silicon semiconductor material (a-Si:H) and, as disposed on respective sides thereof, a transparent electrode consisting of a transparent electrically conductive film and a rear electrode consisting of an opaque metallic layer. The light incident on the transparent electrode impinges on the underlying photosensitive layer. The rear electrode which serves to collect the photocurrent generated in the photosensitive layer is not only required to be low in electric resistivity but high in reflectance with respect to incident light. Moreover, it must have high thermal stability as well as a high bonding affinity for the photosensitive layer. High mechanical strength, such as resistance to injury, is another requisite. The electric resistivity of the electrode is closely related with the voltage drop and the heat generated at the electrode, while the reflectance is closely associated with the efficiency of photoelectric conversion. The thermal stability, bond strength, and mechanical strength of the device, too, are important factors determinant of the reliability of the whole device. The cost of materials is also preferably as low as possible, of course.

In an amorphous silicon solar cell where a-Si:H, for instance, is a major component of its photosensitive layer, either Al or Ag has been conventionally utilized for the reverse electrode. Although Al has a comparatively satisfactory bonding affinity for a-Si:H, this material is not only relatively high in electric resistivity and low in reflectivity but is inadequate in thermal stability. In contrast, Ag is low in electric resistivity and high in reflectance in the long-wavelength part of the visible region of the solar spectrum but is low in bonding affinity for a-Si:H and, hence, insufficient in reliability. As possible alternative electrode materials the electric resistivity values of which are lower than the resistivity of Al, there may be mentioned Cu and Au in addition to Ag. However, Ag and Cu are disadvantageous in that both are rather susceptible to injury and are expensive. All told, none of Al, Ag, Cu, and Au are able to satisfy all of the aforesaid requirements, namely low electric resistance, high reflectance, high stability to heat at the interface, high bond strength, high mechanical strength, and low cost, insofar as they are used alone as the constituent material of the rear electrode.

In view of the above drawbacks of the prior art photovoltaic devices, the present applicant previously proposed a rear electrode for solar cell use, which consists of a plurality of alternate layers of Al and Ag (Al/Ag multi-layer system) (Japanese Patent Application No. 1-249423).

This system not only improved the bond strength between the reverse electrode and a-Si:H as compared with the system in which Ag alone was employed but also obviated the problem of insufficient thermal stability which was inevitable when Al was used alone. Moreover, since the characteristic high reflectance of the Ag reverse electrode could be advantageously exploited in this solar cell, a higher short-circuit current could be obtained than was the case with Al alone, with the result that a device with an improved photoelectric conversion efficiency could be implemented. However, with the recently increasing device density, the generation of heat in the Al layers of high electric resistivity has by now become a problem which cannot be disregarded.

Therefore, the object of the present invention is to resolve all the aforementioned problems by constituting a multi-layer rear electrode using Cu, Ag, and Au, all of which are monovalent metal elements having lower electric resistivity values than the resistivity value of Al, in a certain combination and thereby provide a photovoltaic device of high efficiency and high dependability through the use of such a rear electrode satisfying, as aforesaid, all the multiple requirements of low resistance, high reflectance, high thermal stability, high bond strength, high mechanical strength, and low cost.

SUMMARY OF THE INVENTION

The photovoltaic device of the present invention comprises a multi-layer device including, as disposed on the side of a semiconductor photosensitive layer which is opposite to the side on which light is incident, a rear electrode consisting of a plurality of alternate layers, each in a thickness of 0.3 to 50 nm, of two or more metals chosen from the group consisting of Cu, Ag, and Au. Of the various possible combinations of these elements, the combination of Cu and Ag is most advantageous for several reasons that will be mentioned hereinafter. The preferred thickness of each Cu or Au layer in this rear electrode is 0.3 to 20 nm and that of each Ag layer is 1 to 50 nm. More preferably, the thickness of the Cu or Au layer is 0.3 to 5 nm and that of the Ag layer is 1 to 20 nm. The overall thickness of the rear electrode is preferably 20 nm to 1 $\mu$m.

Since alloying generally results in improved mechanical strength, it might be contemplated to use an alloy of Cu and Ag (Cu+Ag) for implementing an injury-proof low-resistance rear electrode but actually the resulting disturbance of electric potential within the alloy results in increased electric resistivity. However, in the multi-layer rear electrode consisting of alternate layers of Cu, Ag, and/or Au, the existence of interfaces leads to increased mechanical strength just as in the case of an alloy, while the resistance is decreased as compared with the alloy because each layer is composed of a single substance. From the standpoints of electric resistance and mechanical strength, the thickness of each layer should be 0.3 to 50 nm.

Cu, Ag, and Au are all monovalent metals of low electric resistivity and do not evoke interfacial electron scattering due to differences in valency. Therefore, by using these metals, a low-resistance multi-layer rear electrode can be implemented. Since, among these metals, Cu and Ag are less expensive and lower in resistivity than Au, they can constitute the most desirable system.

For use of a Cu/Ag multi-layer system or an Au/Ag multi-layer system as the multi-layer rear electrode on a semiconductor photosensitive layer, the thicknesses of each Cu or Au layer and that of each Ag layer are preferably 0.3 to 20 nm and 1 to 50 nm, respectively, taking into account the diffusion of Cu or Au into the photosensitive layer. The more preferred thickness range is 0.3 to 5 nm for Cu or Au and 1 to 20 nm for Ag. Considering the reliability of the device and the production time which depends on the film-forming technique such as vapor deposition, sputtering or the like, the total thickness of the rear electrode is preferably in the range of 20 nm to 1 μm and more desirably between 20 and 500 nm.

Inasmuch as the photovoltaic device of the invention has, as disposed on a semiconductor photosensitive layer, a multi-layer rear electrode consisting of 0.3 to 50 nm-thick layers of Cu/Ag and Au which are lower in electric resistivity than Al and uniform in valency (monovalent metals), it satisfies all the aforesaid requirement of low electric resistance, high reflectance, high thermal stability, high bond strength, high mechanical strength, and low cost. Particularly when the multi-layer rear electrode on the semiconductor photosensitive layer is a Cu/Ag multi-layer structure or an Au/Ag multi-layer structure, the diffusion of Cu or Au into the photosensitive layer can be effectively inhibited by selecting the thickness of each Cu or Au layer in the range of 0.3 to 20 nm and that of each Ag layer in the range of 1 to 50 nm or selecting the thickness of each Cu or Au layer in the range of 0.3 to 5 nm and that of each Ag layer in the range of 1 to 20 nm to thereby implement a stable photovoltaic device.

DETAILED DESCRIPTION OF THE PREFERRED EMBODIMENT

Figure 1:
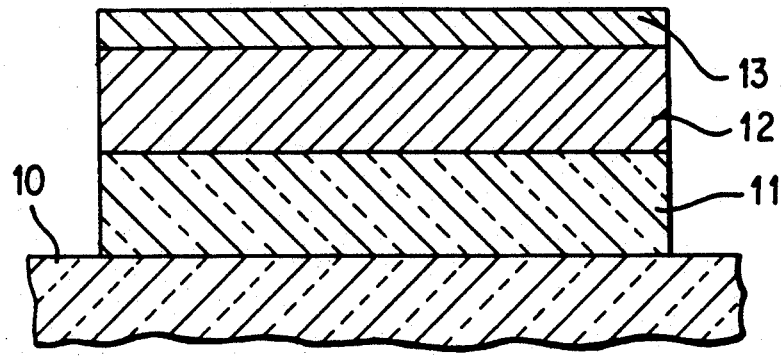
FIG. 1 is a sectional view showing an amorphous silicon solar cell as a photovoltaic device embodying the principles of the invention.

An amorphous silicon solar cell, as an embodiment of the photovoltaic device of the invention, is now described. FIG. 1 is a sectional view of the solar cell according to this embodiment.

As illustrated, a 450 nm-thick transparent conductive film of tin oxide for use as a transparent electrode 11 was first formed on a 1.1 mm-thick glass substrate 10 by thermal chemical vapor deposition.

Then, an a-Si:H-based pin junction photosensitive layer 12 was formed on the above film 11. For this purpose, a mixed gas composed of $SiH_4$, $CH_4$, and $B_2H_6$ was first decomposed in a capacity-coupled glow-discharge apparatus so that a p-type a-Si:H layer was formed in a thickness of 15 nm. In the subsequent formation of an i-type a-Si:H layer, a mixed gas of $SiH_4$ and $H_2$ was usd to form a 450 nm thick film. Then, a mixed gas composed of $SiH_4$, $PH_3$, and $H_2$ was decomposed in the same apparatus to form an n-type microcrystalline Si semi-conductor layer in a thickness of 30 nm. The substrate temperature and the degree of vacuum for this formation of the a-Si:H photosensitive layer 12 were 200° C. and 0.5–1.0 Torr.

Finally, Cu and Ag were deposited alternately in thicknesses of 0.3 to 50 nm to provide a rear electrode 13. For this purpose, Cu and Ag in tungsten boats were independently evaporated by resistance heating in a vacuum of $10^{-6}$ Torr. During this operation, the deposition rate of each metal was maintained at 0.1 nm/s and the substrate was not heated. Moreover, shutters were disposed on the side of the substrate and on the side of the vapor sources, while a film thickness gauge was disposed near the substrate. By means of a film thickness controller using said film thickness gauge as a monitor probe, the opening and closing of the respective shutters were controlled so as to deposit Cu and Ag alternately.

The performance of the solar cell thus fabricated is now described.

First, a multi-layer electrode (period 8 nm) with a total thickness of 160 nm as obtained by 20 alternately successive depositions each of Cu(4 nm each) and Ag(4 nm) and a multi-layer electrode (period 20 nm) with the same total thickness as obtained by 8 alternately successive depositions each of Cu(10 nm) and Ag(10 nm) were investigated in regard to scratch resistance. Whereas a solid Ag electrode, also 160 nm thick, was easily marred by scratching, the above two multi-layer electrodes were scratch-resistant and not easily delaminated. Moreover, when the electric resistance values of the two multi-layer electrode samples were compared with those of the corresponding alloy electrodes of the same size, the resistance value of the multi-layer electrode with a period of 8 nm was about 85% and that of the multi-layer electrode with a period of 20 nm was about 60% of the resistance values of the respective alloy electrodes. It should be noted that the multi-layer electrode systems and the alloys were equal in Cu/Ag atomic ratio.

Table 1 shows the initial characteristics of solar cells (samples SC1, SC2, and SC3) having various Cu/Ag multi-layer rear electrodes 13 and solar cells (samples SC4 and SC5 : Comparative Examples) each having a single-layer rear electrode. In the table, Jsc stands for short-circuit current, Voc for open-circuit voltage, FF for fill factor, and $\eta$ for photoelectric conversion efficiency.

TABLE 1

| Sample | Device structure | Jsc (mA/cm$^2$) | Voc (V) | FF (%) | $\eta$ (%) |
| --- | --- | --- | --- | --- | --- |
| SC1 | a-Si:H/(Ag 4 nm + Cu 4 nm) × 20 | 16.3 | 0.919 | 65.8 | 9.89 |
| SC2 | a-Si:H/(Cu 4 nm + Ag 4 nm) × 20 | 14.4 | 0.310 | 24.8 | 1.11 |
| SC3 | a-Si:H/(Cu 4 nm + Ag 16 nm) × 8 | 15.6 | 0.914 | 65.6 | 9.35 |
| SC4 | a-Si:H/Ag 160 nm | 15.8 | 0.907 | 62.9 | 9.01 |
| SC5 | a-Si:H/Cu 160 nm | 10.8 | 0.428 | 25.7 | 1.19 |

Each of samples SC1 and SC2 is a solar cell equipped with a multi-layer rear electrode 13 having a total thickness of 160 nm as prepared by 20 alternately successive depositions each of Cu(4 nm) and Ag(4 nm) on an a-Si:H photosensitive layer. However, an Ag layer was first deposited in the case of SC1, while a Cu layer was first deposited in the case of SC2. In sample SC3, a multi-layer rear electrode 13 with a total thickness of 160 nm was constructed by 8 alternately successive depositions each of Cu(4 nm) and Ag(16 nm) on an a-Si:H photosensitive layer 12. To fabricate sample SC4, an Ag single-layer rear electrode with a thickness of 160 nm was formed on a similar a-Si:H photosensitive layer. Sample SC5 was similarly constructed using a Cu single-layer rear electrode with a thickness of 160 nm.

Comparison between SC1 and SC2 indicates clearly that when the rear electrode 13 is constructed by depositing Cu and Ag in alternate 4 nm-thick layers, the order of deposition has a marked influence on the performance of the solar cell. Thus, whereas sample SC1 in which the a-Si:H photosensitive layer 12 is immediately adjacent to an Ag layer shows a high photoelectric conversion efficiency of $\eta = 9.89\%$, sample SC2 in which the photosensitive layer 12 is adjacent to a Cu layer shows an extremely low efficiency of the order of 1% just as sample SC5 having a Cu single-layer rear electrode. The low efficiency of SC2 may be attributed to the diffusion of Cu into the a-Si:H constituting the photosensitive layer 12. However, even though the photosensitive layer 12 adjoins a Cu layer, SC3 in which Ag layers are as thick as 16 nm each shows a high efficiency of 9.35% as, here, the diffusion of Cu is virtually inhibited.

Figure 2:
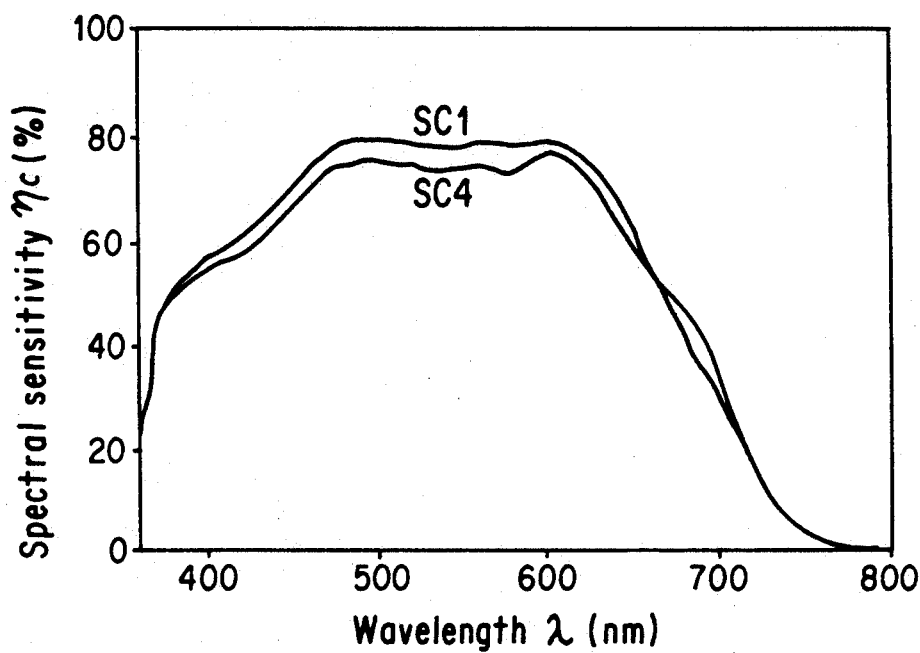
FIG. 2 is a graph comparing the spectral sensitivity characteristic of the above solar cell with that of a comparison solar cell.

FIG. 2 is a graph comparing the spectral sensitivity characteristic of a solar cell as an embodiment of the invention (sample SC1) with that of a comparative example (sample SC4). The reflectance characteristic of the Cu/Ag multi-layer structure is close to that of the Ag single-layer structure. The graph shows that there is no remarkable difference in spectral sensitivity characteristic between the solar cell having a Cu/Ag multi-layer rear electrode and the solar cell having an Ag single-layer rear electrode and that the solar cell having a Cu/Ag multi-layer rear electrode shows superior spectral sensitivity in the long-wavelength portion, i.e. 600–800 nm, of the visible region of the solar spectrum.

Figure 3:
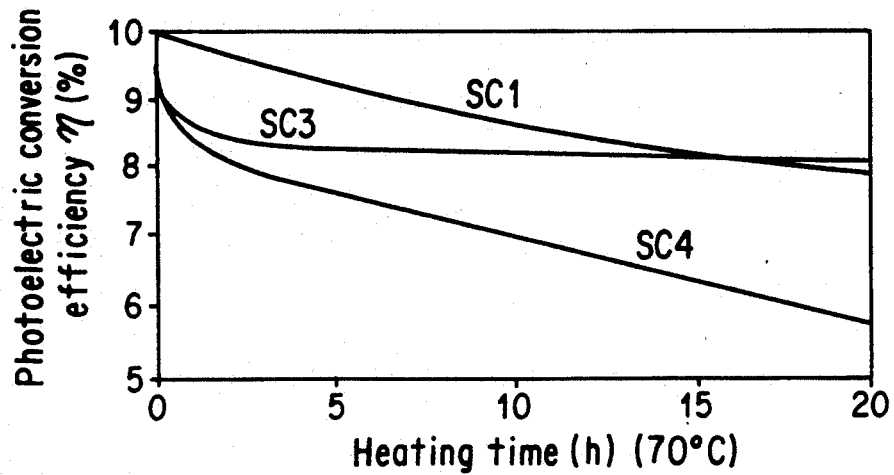
FIG. 3 is a graph comparing the time course of photoelectric conversion efficiency of the above solar cell in a thermal aging test at 170° C. with that of a comparison solar cell.

When a solar cell is used outdoors for a long time, the cell performance deteriorates gradually with time due to the thermal diffusion of the rear electrode material into the a-Si:H constituting the photosensitive layer. FIG. 3 is a graph comparing the time course of photoelectric conversion efficiency $\eta$ of the examples (samples SC1 and SC3) as found in an accelerated aging test carried out at 170° C. with that of a comparative example (sample SC4). As shown, whereas the photoelectric conversion efficiency of the solar cell having an Ag single-layer rear electrode (sample SC4) decreased from the initial level of 9.01% to 5.7% in 20 hours, the efficiencies of the solar cells each having a Cu/Ag multi-layer rear electrode (sample SC1: initial efficiency 9.89%, sample SC2: initial efficiency 9.35%) were still as high as over 8% even after 20 hours, indicating their satisfactory stability to heat. In the case of sample SC3, however, the loss of efficiency during the initial few hours was greater than that of sample SC1, although the subsequent decrease in efficiency was minimal. This is probably because the diffusion of Cu does not take place any longer after Cu in the 4 nm-thick layer immediately adjacent to the a-Si:H photosensitive layer has diffused into the photosensitive layer.

Cu, Ag, and Au are all monovalent metals with low electric resistivity and cause little interfacial electron scattering in any combination so that a low-resistance multi-layer rear electrode can be successfully implemented. However, the combination of Cu and Ag, among these metals, is particularly preferred because of their price advantage and lower resistivity features as compared with Au.

In using such a Cu/Ag multi-layer structure or an Au/Ag multi-layer structure as the rear electrode 13 on the semiconductor photosensitive layer 12, it is advisable to insure that, taking into consideration the diffusion of Cu or Au into the photosensitive layer 12, the thickness of each Cu or Au layer be selected in the range of 0.3 to 20 nm and that of each Ag layer be selected in the range of 1 to 50 nm. The more preferred range is 0.3 to 5 nm for the Cu or Au layer and 1 to 20 nm for the Ag layer. The recommended total thickness of the rear electrode 13 is 20 nm to 1 μm, preferably 20 to 500 nm, from the standpoints of reliability and production time.

What is claimed is:

1. A photovoltaic device having a rear electrode disposed on one side of an amorphous semiconductor photosensitive layer which is opposite to the side on which light is incident, which rear electrode comprises a multi-layer structure obtained by alternately successive depositions, each in a thickness of 0.3 to 50 nm, of two monovalent metals selected from the group consisting of Cu and Ag.

2. A photovoltaic device according to claim 1 wherein the thickness of each Cu layer is selected in the range of 0.3 to 20 nm and that of each Ag layer is selected in the range of 1 to 50 nm.

3. A photovoltaic device according to claim 1 wherein the thickness of each Cu layer is selected in the range of 0.3 to 5 nm and that of each Ag layer is selected in the range of 1 to 20 nm.

4. A photovoltaic device according to claim 1 wherein the total thickness of said rear electrode is 20 nm to 1 μm.

5. A photovoltaic device having a rear electrode disposed on one side of an amorphous semiconductor photosensitive layer which is opposite to the side on which light is incident, which rear electrode comprises a multi-layer structure obtained by alternately successive depositions, each in a thickness of 0.3 to 50 nm, of at least two monovalent metals selected from the group consisting of Cu, Ag, and Au.

6. A photovoltaic device according to claim 1 wherein the thickness of each Cu or Au layer is selected in the range of 0.3 to 20 nm and that of each Ag layer is selected in the range of 1 to 50 nm.

7. A photovoltaic device according to claim 1 wherein the thickness of each Cu or Au layer is selected in the range of 0.3 to 5 nm and that of each Ag layer is selected in the range of 1 to 20 nm.

8. A photovoltaic device according to claim 5 wherein the total thickness of said rear electrode is 20 nm to 1 μm.